United States Patent [19]

Jason

[11] Patent Number: 4,694,201

[45] Date of Patent: Sep. 15, 1987

[54] CURRENT-SAVING CMOS INPUT BUFFER

[75] Inventor: Barry L. Jason, Bedford, Tex.

[73] Assignee: Motorola, Inc., Schaumburg, Ill.

[21] Appl. No.: 728,715

[22] Filed: Apr. 30, 1985

[51] Int. Cl.⁴ .................. H03K 19/092; H03K 17/16; H03L 5/00; H03F 3/18

[52] U.S. Cl. .................................... 307/475; 307/443; 307/451; 307/264; 330/264; 330/280

[58] Field of Search ............... 330/264, 280; 307/585, 307/264, 579, 443, 451, 475

[56] References Cited

U.S. PATENT DOCUMENTS

| | | | |
|---|---|---|---|
| 3,631,528 | 12/1971 | Green | 307/251 |
| 4,038,607 | 6/1977 | Schade | 330/264 |
| 4,042,839 | 8/1977 | Araki | 307/270 |
| 4,071,783 | 1/1978 | Knepper | 307/270 |
| 4,219,743 | 8/1980 | Millns et al. | 307/270 |
| 4,412,139 | 10/1983 | Horninger | 307/270 |
| 4,443,715 | 4/1984 | Fox | 307/270 |
| 4,477,735 | 10/1984 | Gollinger et al. | 307/270 |

FOREIGN PATENT DOCUMENTS

| | | | |
|---|---|---|---|
| 2502697 | 8/1975 | Fed. Rep. of Germany | 330/264 |
| 57-166738 | 10/1982 | Japan | |
| 57-212827 | 12/1982 | Japan | |
| WO81/01781 | 6/1981 | PCT Int'l Appl. | |

OTHER PUBLICATIONS

IBM Technical Disclosure Bulletin–vol. 20, No. 4, Sep., 1977, "High Speed, High Level Signal Driver" by J. Bula, C. Martin and A. C. Patrawala.

Primary Examiner—John S. Heyman
Assistant Examiner—M. R. Wambach
Attorney, Agent, or Firm—F. John Motsinger; Steven G. Parmelee

[57] ABSTRACT

A current-saving CMOS signal input buffer is provided, having at least two CMOS output transistors (each having an input) connected in complementary fashion with a common output taken therebetween, complementary current mirrors coupled to the output transistor inputs, an input signal capacitively coupled to at least one of the output transistor inputs, a reference impedance coupled between the complementary current mirrors, and isolation impedances coupled between the complementary current mirrors and the output transistor inputs.

5 Claims, 1 Drawing Figure

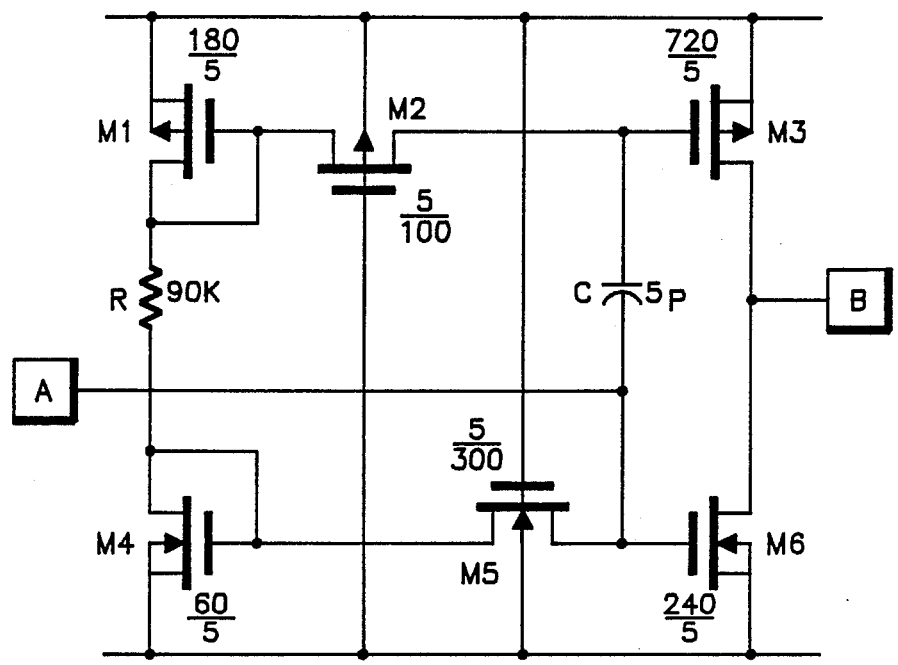

CURRENT-SAVING CMOS INPUT BUFFER

THE FIELD OF INVENTION

The invention disclosed herein is, generally, concerned with signal input buffers.

More particularly, this invention relates to complementary metal-oxide semiconductor (CMOS) signal input buffers.

BACKGROUND OF THE INVENTION

The need for this invention arose from problems of buffer current drain. In conventional input buffers (M3/M6), the DC supply current increases dramatically as the supply voltage increases. Specifically, the bias current is proportional to the square of the supply voltage impressed across a CMOS integrated circuit (IC). Accordingly, when large supply voltages are supplied to facilitate large signal output swings, the CMOS IC consumes a great deal of power.

The instant invention solves the problem by current mirror biasing via a biasing resistor and capacitively coupling the buffer output devices. As a result, bias current only goes up linearly with changes in supply voltage. Thus, a significant current savings is achieved. Moreover, a significantly lower IC operating temperature is attained.

This invention represents a significant advance over the prior art and over this technical field by providing a current-saving CMOS signal input buffer.

BRIEF SUMMARY OF THE INVENTION

It is the object of the present invention to provide a current-saving CMOS signal input buffer.

It is a further object of the invention to provide a CMOS signal input buffer that has only a moderate current increase with increasing supply voltage.

A further object of the present invention is to realize a relatively low operating temperature.

Another object of the invention is to provide an input buffer that has a minimum signal propagation delay from its input to its output.

Yet another object of the present invention is to provide a buffer to shift the small signals at the buffer input to large signals at the buffer output.

A final object of the invention is to provide a buffer to level shift small prescaler input into the large output signal required by a CMOS synthesizer.

The ultimate object is to provide a current-saving CMOS signal input buffer.

In accordance with the present invention, there is provided a current-saving CMOS signal input buffer comprising current mirror biasing via a biasing resistor and capacitively coupling the buffer output devices.

A current-saving CMOS signal input buffer is provided, having at least two CMOS output transistors (each having an input) connected in complementary fashion with a common output taken therebetween, complementary current mirrors coupled to the output transistor inputs, an input signal capacitively coupled to at least one of the output transistor inputs, a reference impedance coupled between the complementary current mirrors, and isolation impedances coupled between the complementary current mirrors and the output transistor inputs.

Thus, there has been provided a current-saving CMOS signal input buffer.

BRIEF DESCRIPTION OF THE DRAWINGS

Additional objects, features, and advantages, in accordance with the present invention, will be more clearly understood, by way of unrestricted example, from the following detailed description, taken together with the accompanying drawing, in which:

The single FIGURE is a schematic circuit diagram illustrating a current-saving CMOS signal input buffer, which incorporates the preferred embodiment of the present invention.

The invention will be readily appreciated by reference to the detailed description when considered in conjunction with the accompanying drawing.

THE DESCRIPTION OF THE PREFERRED EMBODIMENT

The single FIGURE illustrates a current-saving CMOS signal input buffer, which incorporates the preferred embodiment of the present invention.

The current-saving complementary metal-oxide semiconductor (CMOS) signal input buffer consists of six metal-oxide semiconductor (MOS) transistors arranged in complementary fashion (M1/M4, M2/M5 and M3/M6), a biasing resistor R, a coupling capacitor C, an input pad A and an output pad B.

The purpose of the current-saving CMOS signal input buffer, in the preferred embodiment, is to accept small input signals of about one volt peak-to-peak from a frequency synthesizer prescaler at the input pad A and to convert them into large signals that swing between the negative and positive supply voltages to be output to a CMOS frequency synthesizer at the output pad B. For high-speed operation, the buffer is to exhibit a minimum of signal propagation delay from the input pad A to the output pad B.

Two MOS transistors (M1 and M4) and the resistor form a bias string which, through scaled current mirrors (M1 and M4), set the quiescent operating point of the output amplifying devices (M3 and M6).

The two remaining MOS transistors (M2 and M5) are used to implement high-valued resistors. The purpose of the high-valued resistance is to isolate the low impedance at the gates and drains of the current mirrors (M1 and M4) from the input signal at the input pad A. Accordingly, a high input impedance is maintained for the buffer. With the input A open-circuited, no current flows through these (M2 and M5) high-valued resistances.

Primarily though, they (M2 and M5) serve to apply the same gate-to-source bias voltages to the output devices (M3 and M6) as exists on the current mirrors (M1 and M4). Thus, the output current is a scaled multiple of the bias current set by the 90K resistor R in the bias string.

Since the same current can be flowing in each of the output devices (M3 and M6), the amplified output signal will be centered between the positive and negative supplies. Therefore, small signal changes at the input pad A will be converted into large changes at the output pad B.

The 5p coupling capacitor C causes the signal input A to be coupled to the gate of one of the output devices M3 as well as being DC coupled to the other output device M6. This arrangement speeds the operation of the buffer because the first output device M3 turns on and off in a complementary fashion with the other output device M6.

Thus, there has been provided a current-saving CMOS signal input buffer.

Further, there has been provided a current-saving CMOS signal input buffer that has only a moderate current increase with increasing supply voltage, realizes a relatively low operating temperature, has a minimum signal propagation delay from its input to its output, shifts the small signals at the buffer input to large signals at the buffer output and level shifts small prescaler inputs into the large output signals required by a CMOS synthesizer.

The foregoing description is merely illustrative of the broad inventing concept comprehended by the invention and has been given for clarity of understanding by way of unrestricted example. However, it is not intended to cover all changes and modifications which do not constitute departures from the spirit and scope of the invention.

What I claim and desire to secure by Letters Patent is:

1. A current saving CMOS signal buffer comprising:
   input means for receiving an input signal;
   output means for providing an output signal;
   at least two CMOS output transistors connected in a push-pull configuration between a supply voltage differential comprising a positive supply voltge and a negative supply voltage said CMOS output transistors having their gates connected in common to said input means and wherein a common output between said transistors connects to said output means;
   means coupled to said two CMOS output transistors forming first and second current mirrors for providing a source of substantially constant current mirrored to said output transistors; and
   such that current flows through said output transistors to increase substantially linearly as said supply voltage differential increases linearly.

2. The buffer of claim 1 wherein an impedance is coupled between said first and second current mirrors.

3. The buffer of claim 1 and further including isolation means for providing an impedance between said means for providing a source of substantially constant current means and said output transistors.

4. The buffer of claim 3 wherein:
   said isolation means includes first and second transistors coupled between said first and second current mirrors and said output transistors, respectively.

5. The buffer of claim 1 and further including a capacitor coupled between said input means and only one of said output transistors.

* * * * *